(12) United States Patent
Rehmeyer et al.

(10) Patent No.: US 11,776,612 B2
(45) Date of Patent: Oct. 3, 2023

(54) MEMORY WITH PER DIE TEMPERATURE-COMPENSATED REFRESH CONTROL

(71) Applicant: Micron Technology, Inc., Boise, ID (US)

(72) Inventors: James S. Rehmeyer, Boise, ID (US); Jason M. Johnson, Nampa, ID (US); Joo-Sang Lee, Frisco, TX (US)

(*) Notice: Subject to any disclaimer, the term of this patent is extended or adjusted under 35 U.S.C. 154(b) by 0 days.

(21) Appl. No.: 17/545,966

(22) Filed: Dec. 8, 2021

(65) Prior Publication Data
US 2022/0101913 A1    Mar. 31, 2022

Related U.S. Application Data

(63) Continuation of application No. 16/921,729, filed on Jul. 6, 2020, now Pat. No. 11,200,939.

(51) Int. Cl.
*G11C 11/406* (2006.01)
*G06F 11/30* (2006.01)

(52) U.S. Cl.
CPC .... *G11C 11/40626* (2013.01); *G06F 11/3037* (2013.01); *G06F 11/3058* (2013.01); *G11C 11/40607* (2013.01); *G11C 11/40622* (2013.01)

(58) Field of Classification Search
CPC ........ G11C 11/40626; G11C 11/40622; G11C 11/40607; G06F 11/3037; G06F 11/3058
See application file for complete search history.

(56) References Cited

U.S. PATENT DOCUMENTS

| 9,653,142 | B1 | 5/2017 | Kihara |
| 2012/0099389 | A1 | 4/2012 | Park et al. |
| 2013/0301371 | A1 | 11/2013 | Chen |
| 2014/0068171 | A1 | 3/2014 | Lee |
| 2018/0197599 | A1 | 7/2018 | Choi et al. |
| 2018/0293029 | A1 | 10/2018 | Achtenberg et al. |

FOREIGN PATENT DOCUMENTS

WO    2020101975 A1    5/2020

OTHER PUBLICATIONS

International Application No. PCT/US2021/040246—International Search Report and Written Opinion, dated Oct. 18, 2021, 10 pages.

*Primary Examiner* — Ajay Ojha
(74) *Attorney, Agent, or Firm* — Holland & Hart LLP

(57) ABSTRACT

Memory devices, systems, and associated methods with per die temperature-compensated refresh control, and associated methods, are disclosed herein. In one embodiment, a memory device includes a plurality of memory cells and a sensor configured to measure a temperature of the memory device. The memory device determines a frequency at which it is receiving refresh commands. The memory device is further configured to skip refresh operations of the memory cells based, at least in part, on the determination and on the temperature of the memory device.

20 Claims, 5 Drawing Sheets

MEMORY WITH PER DIE TEMPERATURE-COMPENSATED REFRESH CONTROL

CROSS-REFERENCE TO RELATED APPLICATION(S)

This application is a continuation of U.S. application Ser. No. 16/921,729, filed Jul. 6, 2020; which is incorporated herein by reference in its entirety.

TECHNICAL FIELD

The present disclosure is related to memory systems, devices, and associated methods. In particular, the present disclosure is related to memory devices with per die temperature-compensated refresh control, and associated systems and methods.

BACKGROUND

Memory devices are widely used to store information related to various electronic devices such as computers, wireless communication devices, cameras, digital displays, and the like. Memory devices are frequently provided as internal, semiconductor, integrated circuits, and/or external removable devices in computers or other electronic devices. There are many different types of memory, including volatile and non-volatile memory. Volatile memory, including static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Figure 1:
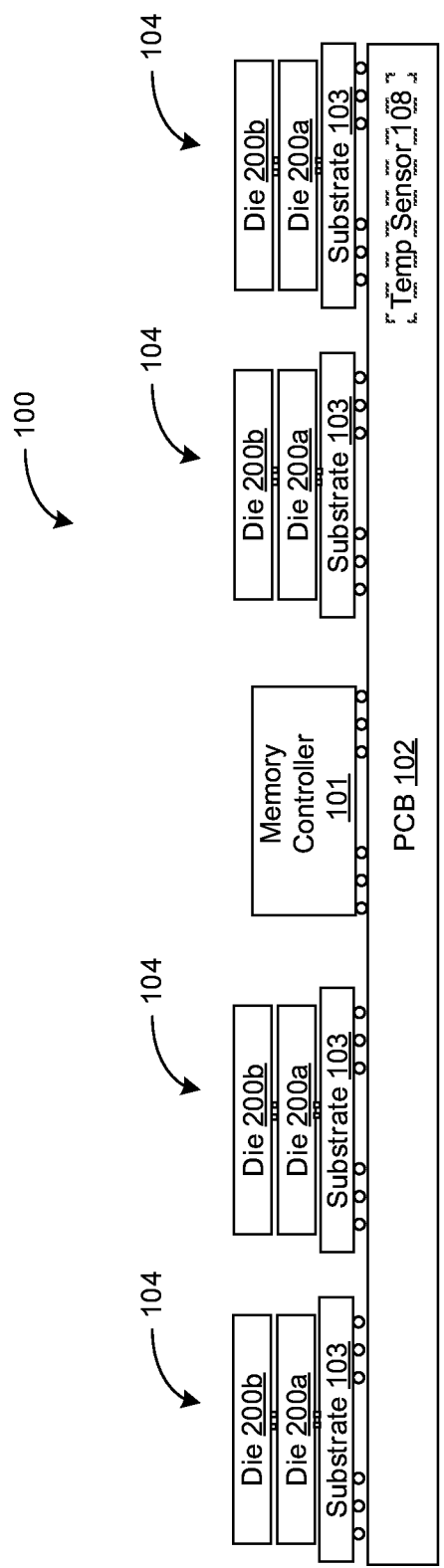
FIG. 1 is a block diagram schematically illustrating a memory system configured in accordance with various embodiments of the present technology.

The technology disclosed herein relates to memory devices (and associated systems and methods) configured to skip refresh operations based, at least in part, on their internal temperatures. In one embodiment, a memory system comprises a memory controller and a plurality of memory devices. The memory controller is configured to monitor at least one temperature of the memory system. When a monitored temperature reaches or exceeds a threshold temperature value, the memory controller increases the frequency at which the controller sends refresh commands to the memory devices. The controller further notifies the memory devices of the frequency increase. In turn, each memory device monitors its internal temperature and skips refresh operations when its internal temperature does not meet or exceed the threshold temperature value. In this manner, those memory devices of the memory system having internal temperatures greater than or equal to the threshold temperature value are refreshed at the higher frequency, thereby reducing the amount of power consumed or required by the memory system during refresh operations.

To ameliorate data retention at higher temperatures, memory systems can be configured to increase the frequency at which their memory devices are refreshed when temperatures of the systems exceed a threshold temperature value. Memory systems often, however, monitor temperature sensors that generate temperature measurements representing temperatures of groups of memory devices (e.g., on dual in-line memory modules (DIMMs)). That is, memory systems can be configured to increase the frequency at which refresh commands are issued to every memory device of the system based on a temperature measurement that is generically associated with a group of memory devices. Large temperature variations (e.g., 10-30° C. or more), however, are often observed across memory devices of these groups. Thus, the generic temperature measurements are often not accurate indications of the internal temperatures of every memory device in a group. As a result, several memory devices (e.g., one or more placements of DRAM on a DIMM that contain sixteen or eighteen such placements) may be operating at internal temperatures below the threshold temperature value even when the generic temperature measurement exceeds the threshold temperature value. Because data loss due to temperature is less of a concern in memory devices having internal temperatures below the threshold temperature value, increasing the frequency at which these cooler memory devices are refreshed constitutes a waste of power. Moreover, memory devices are typically not notified of when the frequency at which they are receiving refresh commands from the memory controller has been increased. As a result, memory devices are often unable to determine whether it is appropriate to skip the additional refresh commands received from the memory controller under the increased frequency. As future generations of memory systems include a greater number of memory devices and/or include memory devices positioned at tighter pitches relative to one another, these future memory systems are expected to demand or consume an even greater amount of power and/or to run at higher temperatures. Accordingly, drawbacks of the foregoing refresh approaches involve significant power demands for future memory systems with greater refresh frequencies, more memory devices, and/or higher power density.

To address these concerns, several embodiments of the present technology are directed to memory devices (e.g., volatile memory devices), systems including memory devices (e.g., DIMMs), and methods of operating memory devices in which individual memory devices are configured to monitor their internal temperatures and to skip refresh operations at least when (a) refresh commands are issued at a greater-than-normal frequency and (b) their internal temperatures are below a threshold temperature value. In particular, an individual memory device of the present technology is configured to receive an indication (e.g., from a memory controller) that refresh commands are being issued in accordance with a faster-than-normal refresh rate. In turn, the individual memory device is configured to compare (i) a temperature measurement generated by a temperature sensor internal to the memory device to (ii) a threshold temperature value. When the temperature measurement exceeds (and/or meets) the threshold temperature value, the memory device is configured to refresh memory cells of the memory device in accordance with the faster-than-normal refresh rate to ameliorate data retention at the higher temperatures. Otherwise, the memory device is configured to skip executing at least a subset (e.g., every other, every third, etc.) of refresh commands received (e.g., from a memory controller), thereby reducing the amount of power required or consumed by the memory device during refresh operations.

In the illustrated embodiments below, the memory systems and devices are primarily described in the context of devices incorporating DRAM storage media. Memory systems and devices configured in accordance with other embodiments of the present technology, however, can include other types of memory systems and devices incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media. Furthermore, a person skilled in the art will understand that the technology may have additional embodiments and that the technology may be practiced without several of the details of the embodiments described below with reference to FIGS. 1-5.

As used herein, the terms "memory system" and "memory device" refer to systems and devices configured to temporarily and/or permanently store information related to various electronic devices. Accordingly, the term "memory device" can refer to a single memory die and/or to a memory package containing one or more memory dies. Similarly, the term "memory system" can refer to a system including one or more memory dies (e.g., a memory package) and/or to a system (e.g., a dual in-line memory module (DIMM)) including one or more memory packages.

FIG. 1 is a block diagram schematically illustrating a memory system 100 (e.g., a dual in-line memory module (DIMM)) configured in accordance with various embodiments of the present technology. The memory system 100 can be connected to any one of a number of electronic devices that is capable of utilizing memory for the temporary or persistent storage of information, or a component thereof. For example, the memory system 100 can be operably connected to a host device (not shown). The host device may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio, and/or video; a vehicle; an appliance; a toy; or any one of a number of other products. In one embodiment, the host device may be connected directly to the memory system 100, although, in other embodiments, the host device may be indirectly connected to the memory system 100 (e.g., over a networked connection or through intermediary devices).

As shown, the memory system 100 includes a memory controller 101 (e.g., a field programming gate array (FPGA) or other suitable memory controller) and one or more memory devices 104 (e.g., one or more dynamic random-access memory (DRAM) devices) electrically connected to the memory controller 101 via a printed circuit board (PCB) 102 (e.g., via one or more electrical contacts and/or traces). The memory controller 101 can be configured to control one or more operations of the memory system 100. For example, the memory controller 101 can control refresh operations of the memory devices 104. In particular, the memory controller 101 can issue a refresh command to direct one or more of the memory devices 104 to initiate their respective refresh operations.

Individual memory devices 104 of the memory system 100 can include a package substrate 103 and one or more memory dies 200. As illustrated in FIG. 1, each of the memory devices 104 includes a first memory die 200a attached to the package substrate 103, and a second memory die 200b stacked on top of the first memory die 200a. In some embodiments, the first and second memory dies 200a and 200b are each electrically connected to the package substrate 103 (e.g., via one or more electrical contacts and/or traces), which in turn can be electrically connected to the PCB 102. Although the devices 104 illustrated in FIG. 1 are dual die packages (DDP), one or more memory devices 104 configured in accordance with other embodiments of the present technology can include a greater or lesser number of memory dies 200 (e.g., one memory die or more than two memory dies) than illustrated. In these and other embodiments, the orientation of the memory dies included in a memory device 104 can vary. For example, the first and second memory dies 200a and 200b illustrated in FIG. 1 are each oriented face down (e.g., toward the package substrate 103) in a back-to-face orientation. In other embodiments, the first memory die 200a and/or the second memory die 200b can be oriented face up (e.g., away from the package substrate 103) such that the first and second memory dies 202a and 202b are arranged in a face-to-back, face-to-face, and/or back-to-back orientation on a package substrate 103. In these and still other embodiments, the first and second memory dies 200a and 200b can be arranged side-by-side on the package substrate 103, as opposed to the stacked arrangement illustrated in FIG. 1.

In some embodiments, the memory system 100 can further include one or more temperature sensors. In the illustrated embodiment, the memory system 100 includes a temperature sensor 108 positioned within the PCB 102. In other embodiments, the temperature sensor 108 can be positioned at other locations within the memory system 100. For example, the temperature sensor 108 can be positioned within one or more of the package substrates 103, within one or more of the memory dies 200 (e.g., within the first and/or second memory dies 200a and/or 200b), within the memory controller 101, and/or within another component (not shown) of the memory system 100. As described in greater detail below with respect to FIG. 2, the memory system 100 additionally or alternatively includes one or more temperature sensors (not shown in FIG. 1) internal to all or a subset of the memory dies 200 of the memory system 100. Such internal temperature sensors are expected to provide more accurate indications of an individual memory device's 104 and/or an individual memory die's 200 internal temperature than provide by the temperature sensor 108.

In operation, the temperature sensor 108 is configured to generate one or more temperature measurements indicating the temperature of the memory system 100. In the illustrated embodiment, the temperature sensor 108 corresponds to each of the memory devices 104 of the memory system 100. Thus, temperature measurements generated by the temperature sensor 108 generically represent the temperature of each of the memory devices 104. In other embodiments, the temperature sensor 108 can correspond to a subset of the memory devices 104 and/or to one or more other components (e.g., the memory controller 101, the PCB 102, or another component) of the memory system 100. In these and still other embodiments, the memory system can include one or more other temperature sensors similar to the temperature sensor 108, each of which can correspond to a subset of the memory devices 104 and/or to one or more other components (e.g., the memory controller 101, the PCB 102, or another component) of the memory system 100. In contrast, the one or more temperature sensors internal to the memory dies 200 of the memory system 100 are configured to generate temperature measurements representing the temperature of only a corresponding memory die 200.

The temperature sensor 108 and/or the one or more temperature sensors internal to the memory die(s) 200 can be electrically connected to the memory controller 101 such that temperature measurements generated by the temperature sensor(s) are communicated to the memory controller 101. In these embodiments, the memory controller 101 can monitor the temperature measurements to determine a frequency at which to send refresh commands to the memory devices 104. As a specific example, the memory controller 101 can compare (i) a temperature measurement generated by the temperature sensor 108 and/or by one or more temperature sensors internal to the memory die(s) 200 to (ii) a threshold temperature value (e.g., 85° C.). In some embodiments, the threshold temperature value can indicate a temperature threshold above (and/or at) which there is a concern that data retention issues will arise due to the temperatures of the memory devices 104 (e.g., of the memory dies 200) at a given refresh rate (e.g., at a standard, default, or normal refresh rate). Stated another way, the threshold temperature value can indicate a temperature threshold below (and/or at) which there is little concern that data retention issues will arise due to the temperatures of the memory devices 104 at the given refresh rate. Thus, if the memory controller 101 determines that a temperature measurement generated by the temperature sensor 108 and/or the temperature sensor(s) internal to the memory die(s) 200 is less than (and/or equal to) the threshold temperature value, the memory controller 101 can issue refresh commands to the memory devices 104 in accordance with the given refresh rate. For example, the memory controller 101 can issue refresh commands to the memory devices 104 every 7.8 µs for double data rate fourth generation (DDR4) memory devices or every 3.9 µs for double data rate fifth generation (DDR5) memory devices. The term "1× refresh mode" will be used hereinafter to indicate that the memory controller 101 is issuing (or that a memory device 104 or a memory die 200 is receiving) refresh commands in accordance with a normal or default refresh rate.

On the other hand, if the memory controller 101 determines that the temperature measurement is greater than (and/or equal to) the threshold temperature value, the memory controller 101 can issue refresh commands to the memory device 104 in accordance with a refresh rate faster than the given refresh rate. For the sake of clarity and understanding, the faster refresh rate will be discussed hereinafter in the context of being twice the given refresh rate such that refresh commands are issued to the memory devices 104 twice as fast than in accordance with the given refresh rate. Thus, the term "2× refresh mode" will be used hereinafter to indicate that the memory controller 101 is issuing (or that a memory device 104 or memory die 200 is receiving) refresh commands in accordance with a faster refresh rate. Continuing with the numbers from the above example, the memory controller 101 in the 2× refresh mode can issue a refresh command to the memory devices 104 every 3.9 µs for DDR4 memory devices or every 1.95 µs for DDR5 memory devices. A person of ordinary skill in the art will readily recognize that a faster refresh rate can be another multiple (other than twice) faster than the given refresh rate. Such other multiples and corresponding refresh rates fall within the scope of the present technology.

In some embodiments, the memory controller 101 can be configured to issue refresh commands to the memory devices 104 in accordance with the 1× refresh mode by default. Additionally, or alternatively, the memory controller 101 can be configured to issues refresh commands to each of the memory devices 104 in accordance with the 2× refresh mode when a specified number (e.g., one or more) temperature measurements generated by the temperature sensor 108 are greater than (or equal to) a specified threshold temperature value (e.g., 85° C.). In these and other embodiments, the memory controller 101 can be configured to issue refresh commands to each of the memory devices 104 in accordance with the 2× refresh mode when a specified number (e.g., one or more) temperature measurements generated by a specified number (e.g., one or more) of temperature sensors positioned internal to a specified number (e.g., one or more) memory dies 200 are greater than (or equal to) a specified threshold temperature value (e.g., 85° C. or another threshold temperature value). In some embodiments, the memory controller 101 is configured to continue issuing refresh commands to each of the memory devices 104 in accordance with the 2× refresh mode until a specified number (e.g., one or more) of temperature measurements generated by the temperature sensor 108 and/or by a specified number (e.g., one or more) temperature sensors positioned internal to a specified number (e.g., one or more) memory dies 200 are less than (or equal to) a specified threshold temperature value (e.g., 85° C. or another threshold temperature value). In these and still other embodiments, the memory controller 101 can be configured to issue refresh commands to each of the memory devices 104 in accordance with the 1× refresh mode and/or the 2× refresh mode in response to one or more commands received from a host device or another component communicatively connected to the memory controller 101.

As discussed above, large temperature variations (e.g., 10-30° C. or more) are often observed across memory devices of a memory system and/or of a memory DIMM. Thus, the temperature measurements generated by the temperature sensor 108 of FIG. 1 may be accurate indications of the internal temperatures of only a subset of the memory dies 200 of the memory system 100. In other words, one or more of the memory dies 200 may include temperatures below the threshold temperature value even when a temperature measurement generated by the temperature sensor 108 exceeds (and/or meets) a specified threshold temperature value. Because data loss due to temperature is less of a concern in memory dies 200 having internal temperatures below the threshold temperature value, increasing the frequency at which these cooler memory dies 200 are refreshed would constitute a waste of power. That is, if a memory die 200 having an internal temperature below (and/or at) the specified threshold temperature value is sufficiently refreshed under the 1× refresh mode, the cooler memory die 200 would be refreshed at least twice as often as required by changing the refreshing scheme of the cooler memory die 200 to the 2× refresh mode when temperature measurements generated by the temperature sensor 108 and/or by one or more temperature sensors positioned internal to one or more other memory devices 104 or memory dies 200 of the memory system 100 indicate that the other memory devices 104 or memory dies 200 have temperatures above (and/or at) the specified threshold temperature value. In other words, at least every other refresh operation of the cooler memory die 200 under the 2× refresh mode would constitute a waste of power. Furthermore, without an indication that the refresh scheme was changed from the 1× refresh mode to the 2× refresh mode, this cooler memory die 200 would not be able to determine that it is being refreshed under the 2× refresh mode and that it is appropriate to skip at least a subset of the refresh commands received from the memory controller 101 given the cooler memory die's 200 temperature.

To address these concerns (and as discussed in greater detail below with respect to FIGS. 2 and 3), the memory controller 101 is configured to notify the memory devices 104 and/or the memory dies 200 of the current refresh scheme (i.e., whether the memory controller 101 is issuing refresh commands in accordance with the 1× refresh mode or in accordance with the 2× refresh mode). In turn, the memory devices 104 and/or memory dies 200 of the memory system 100 are able to use the notification to determine when it is appropriate to skip refresh operations based, at least in part, on their respective internal temperatures.

Figure 2:
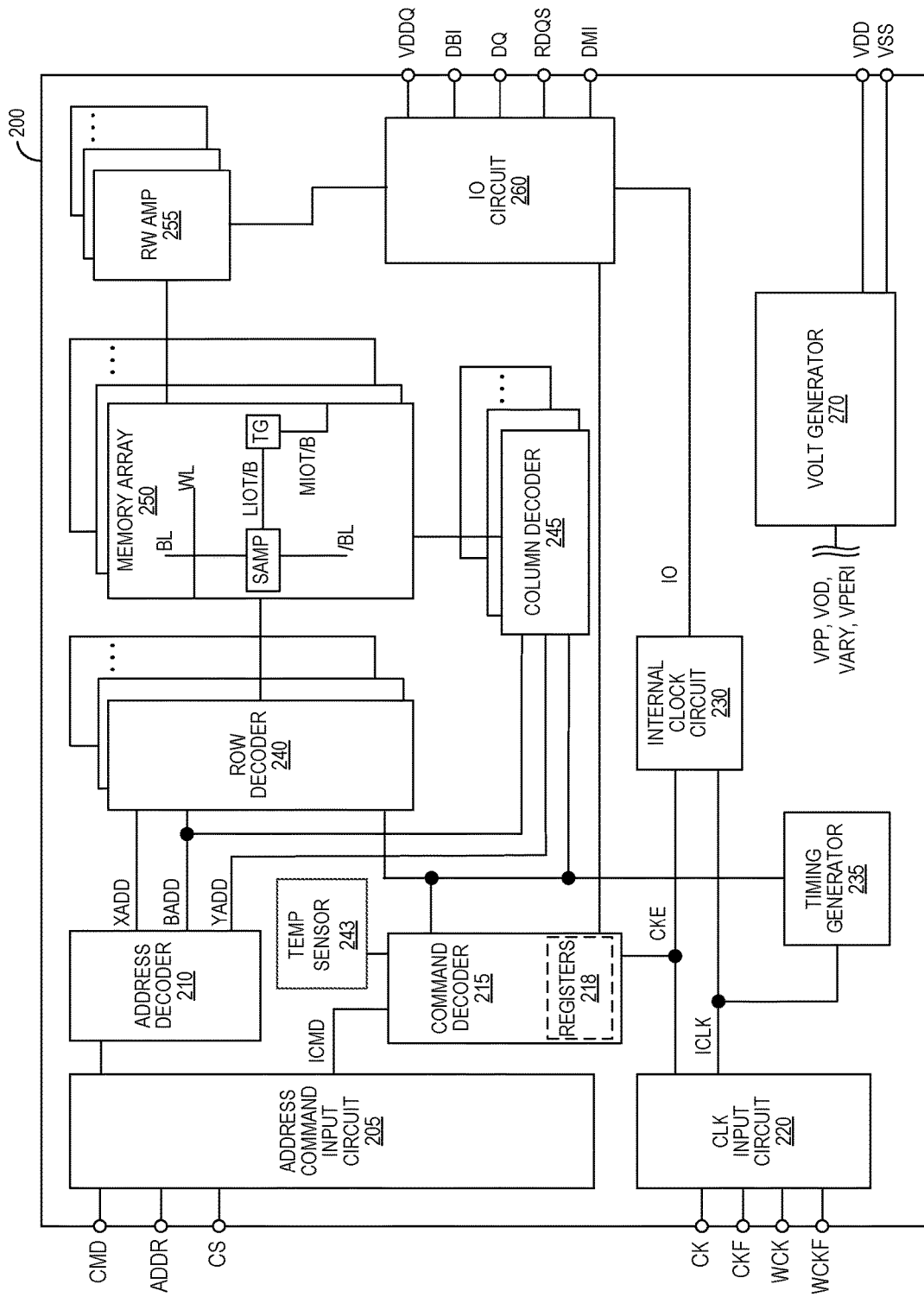
FIG. 2 is a block diagram schematically illustrating a memory device configured in accordance with various embodiments of the present technology.

FIG. 2 is a block diagram schematically illustrating a memory device 200 (e.g., a memory die 200, such as a first memory die 200a and/or a second memory die 200b of FIG. 1) configured in accordance with various embodiments of the present technology. The memory device 200 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI to receive data signals, and power supply terminals VDD, VSS, and VDDQ.

The power supply terminals of the memory device 200 may be supplied with power supply potentials VDD and VSS. These power supply potentials VDD and VSS can be supplied to an internal voltage generator circuit 270. The internal voltage generator circuit 270 can generate various internal potentials VPP, VOD, VARY, VPERI, and the like based on the power supply potentials VDD and VSS. The internal potential VPP can be used in the row decoder 240, the internal potentials VOD and VARY can be used in sense amplifiers included in the memory array 250 of the memory device 200, and the internal potential VPERI can be used in many other circuit blocks.

The power supply terminals may also be supplied with power supply potential VDDQ. The power supply potential VDDQ can be supplied to the IO circuit 260 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 260 so that power supply noise generated by the IO circuit 260 does not propagate to the other circuit blocks.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a CKE signal from a command decoder 215, an input buffer can receive the CK and CKF signals and the WCK and WCKF signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signals based on the received internal clock signals ICLK and a clock enable signal CKE from the command decoder 215. For example, the internal clock circuit 230 can include a clock path (not shown in FIG. 2) that receives the internal clock signal ICLK and provides various clock signals to the command decoder 215. The internal clock circuit 230 can further provide input/output (TO) clock signals. The IO clock signals can be supplied to an input/output (TO) circuit 260 and can be used as a timing signal for determining an output timing of read data and the input timing of write data. The IO clock signals can be provided at multiple clock frequencies so that data can be output from and input into the memory device 200 at different data rates. A higher clock frequency may be desirable when high memory speed is desired. A lower clock frequency may be desirable when lower power consumption is desired. The internal clock signals ICLK can also be supplied to a timing generator 235 and thus various internal clock signals can be generated that can be used by the command decoder 215, the column decoder 245, and/or other components of the memory device 200.

The memory device 200 may include an array of memory cells, such as memory array 250. The memory cells of the memory array 250 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be a one or more memory banks or another arrangement of memory cells. In these and other embodiments, the memory regions of the memory array 250 can be arranged in one or more groups (e.g., groups of memory banks, one or more logical memory ranks or dies, etc.). Memory cells in the memory array 250 can include any one of a number of different memory media types, including capacitive, magnetoresistive, ferroelectric, phase change, or the like. The selection of a word line WL may be performed by a row decoder 240, and the selection of a bit line BL may be performed by a column decoder 245. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 250 may also include plate lines and corresponding circuitry for managing their operation.

The command terminals and address terminals may be supplied with an address signal and a bank address signal from outside the memory device 200. The address signal and the bank address signal supplied to the address terminals can be transferred, via a command/address input circuit 205, to an address decoder 210. The address decoder 210 can receive the address signals and supply a decoded row address signal (XADD) to the row decoder 240, and a decoded column address signal (YADD) to the column decoder 245. The address decoder 210 can also receive the bank address signal (BADD) and supply the bank address signal to both the row decoder 240 and the column decoder 245.

The command and address terminals can be supplied with command signals CMD, address signals ADDR, and chip selection signals CS (e.g., from the memory controller 101 and/or a host device). The command signals may represent various memory commands (e.g., including access commands, which can include read commands and write commands). The chip selection signals CS may be used to select the memory device 104 and/or the memory device 200 to respond to commands and addresses provided to the command and address terminals. When an active CS signal is provided to the memory device 200, the commands and addresses can be decoded and memory operations can be performed. The command signals CMD may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word line and a column command signal to select a bit line. The internal command signals can also include output and input activation commands, such as a clocked command CMDCK (not shown) to the command decoder 215.

The command decoder 215 may further include one or more registers 218 for tracking various counts or values (e.g., counts of refresh commands received by the memory device 200 or self-refresh operations performed by the memory device 200) and/or for storing various operating conditions for the memory device 200 to perform certain functions, features, and modes (refresh modes, test modes, etc.). As such, in some embodiments, registers 218 (or a subset of the registers 218) may be referred to as mode registers. As a specific example, the memory device 200 may be placed into a refresh mode by programming certain bits of the registers 218. Once the memory device 200 is placed into the refresh mode, the memory device 200 can use certain address bits received in the address signals ADDR to determine the frequency at which refresh commands are being sent to the memory device 200 (e.g., by a memory controller 101). For example, the memory device 200 can monitor a specific address bit in ADDR signals received by the memory device 200 (e.g., from the memory controller 101) to determine a current refresh scheme (e.g., 1× refresh mode, 2× refresh mode, etc.) of the corresponding memory system 100. Continuing with this example, the memory device 200 can determine that the memory device 200 is receiving refresh commands in accordance with the 1× refresh mode when the address bit in the ADDR signals received by the memory device 200 is in a first state (e.g., a "high" or "1" state) or that the memory device 200 is receiving refresh commands in accordance with the 2× refresh mode when the address bit is in a second state (e.g., a "low" or "0" state). In other words, a memory controller 101 or other component of a memory system that includes the memory device 200 can notify the memory device 200 of the frequency at which refresh commands are being sent to the memory device 200 using one or more address bits in the ADDR signals sent to the memory device 200.

When a read command is issued to the memory device 200, and a row address and a column address are timely supplied to the memory device 200, read data can be read from memory cells in the memory array 250 designated by the row address and the column address. The read command may be received by the command decoder 215, which can provide internal commands to the IO circuit 260 so that read data can be output from the data terminals DQ, RDQS, DBI, and DMI via read/write (RW) amplifiers 255 and the IO circuit 260 according to the RDQS clock signals. The read data may be provided at a time defined by read latency information RL that can be programmed in the memory device 200, for example in the mode register 218. The read latency information RL can be defined in terms of clock cycles of the CK clock signal. For example, the read latency information RL can be a number of clock cycles of the CK signal after the read command is received by the memory device 200 when the associated read data is provided.

When a write command is issued to the memory device 200, and a row address and a column address are timely supplied to the memory device 200, write data can be supplied to the data terminals DQ, DBI, and DMI over DQ lines connected to the memory device 200 according to the WCK and WCKF clock signals. The write command may be received by the command decoder 215, which can provide internal commands to the IO circuit 260 so that the write data can be received by data receivers in the IO circuit 260, and supplied via the IO circuit 260 and the RW amplifiers 255 to the memory array 250 over IO lines of the memory device 200. The write data may be written in the memory cell designated by the row address and the column address. The write data may be provided to the data terminals at a time that is defined by write latency WL information. The write latency WL information can be programmed in the memory device 200, for example, in the mode register 218. The write latency WL information can be defined in terms of clock cycles of the CK clock signal. For example, the write latency information WL can be a number of clock cycles of the CK signal after the write command is received by the memory device 200 when the associated write data is received.

The memory array 250 may be refreshed or maintained to prevent data loss, either due to charge leakage or imprint effects. A refresh operation may be initiated by the memory device 200, by the memory system 100 (e.g., by the memory controller 101 of FIG. 1), and/or by a host device, and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory device 200 may be configured to refresh the same row of memory cells in every memory bank of the memory array 250 simultaneously. In another approach, the memory device 200 may be configured to refresh the same row of memory cells in every memory bank of the memory array 250 sequentially. In still another approach, the memory device 200 can further include circuitry (e.g., one or more registers, latches, embedded memories, counters, etc.) configured to track row (e.g., word line) addresses, each corresponding to one of the memory banks in the memory array 250. In this approach, the memory device 200 is not constrained to refresh the same row in each memory bank of the memory array 250 before refreshing another row in one of the memory banks.

Regardless of the refresh approach, the memory device 200 can be configured to refresh memory cells in the memory array 250 within a given refresh rate or time window (e.g., 32 ms, 28 ms, 25 ms, 23 ms, 21 ms, 18 ms, 16 ms, 8 ms, etc.), known as tREF. In these embodiments, a corresponding memory device 104 and/or the memory system 100 can be configured to supply refresh commands to the memory device 200 in accordance with a specified minimum cadence tREFI. For example, the memory device 104 and/or the memory system 100 can be configured to supply one or more refresh commands to the memory device 200 in accordance with the 1× refresh mode at least every 7.8 μs for DDR4 memory devices (3.9 μs for DDR5) such that an approximate minimum of 4000 refresh commands (8000 refresh commands for DDR5) are supplied to the memory device 200 within a 32 ms time window. As another example, the memory device 104 and/or the memory system 100 can be configured to supply one or more refresh commands to the memory device 200 in accordance with the 2× refresh mode at least every 3.9 μs for DDR4 memory devices (1.95 μs for DDR5) such than an approximate minimum of 8000 refresh commands (16000 refresh commands for DDR5) are supplied to the memory device 200 within a 32 ms time window.

As discussed above, refresh operations of a memory system 100 and/or a memory device 200 are current-intensive operations that demand and consume a large amount of power. Furthermore, data loss due to temperature is less of a concern in memory devices 200 having internal temperatures below one or more threshold temperature values. Therefore, increasing the frequency at which cooler memory devices 200 are refreshed to ameliorate data retention in other memory devices 200 having higher temperatures would constitute a waste of power.

To address this concern, the memory device 200 illustrated in FIG. 2 includes at least one internal temperature sensor 243. The temperature sensor 243 is configured to generate temperature measurements representing the temperature of only the memory device 200. In some embodiments, the temperature measurements are communicated to the command decoder 215 and/or to a memory controller 101 communicatively coupled to the temperature sensor 243. As discussed in greater detail below with respect to FIG. 3, the memory device 200 can determine whether to skip one or more refresh operations based, at least in part, on the internal temperature of the memory device 200 and on the frequency at which the memory device 200 is receiving refresh commands (indicated in the notification received via the address bits of address signals ADDR received by the memory device 200). As such, each memory device 200 of the memory system 100 can determine whether to skip refresh operations based on its own temperature such that only memory devices 200 having internal temperatures above a threshold temperature value are refreshed in accordance with the 2× refresh mode. In this manner, the total amount of power required or consumed by the memory device 200 for refresh operations is reduced and/or minimized, thereby reducing the total amount of power required or consumed by a corresponding memory system 100.

Figure 2A:
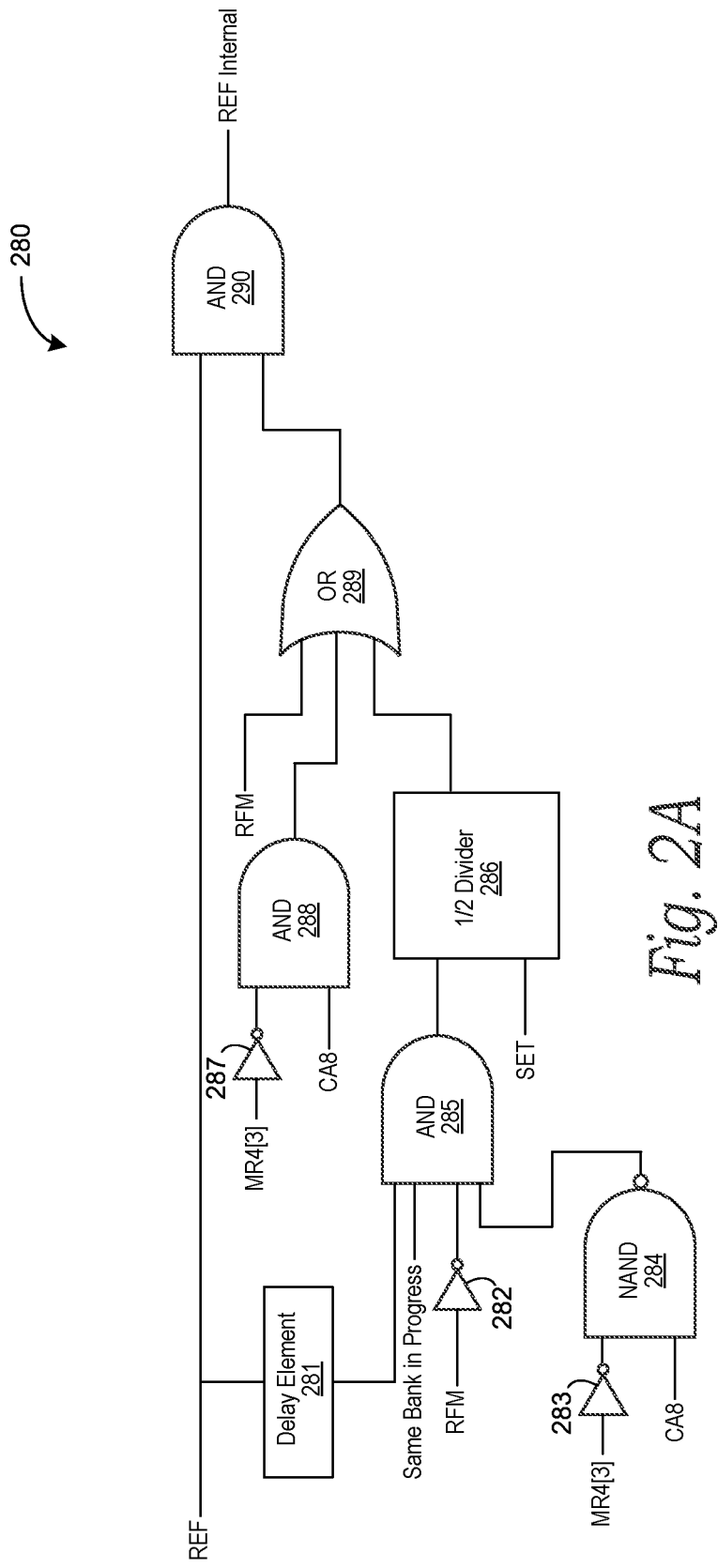
FIG. 2A is a block diagram schematically illustrating a refresh control circuit configured in accordance with various embodiments of the present technology.

FIG. 2A is a block diagram schematically illustrating a refresh control circuit 280 of a memory device 200 (FIG. 2), configured in accordance with various embodiments of the present technology. As shown, the refresh control circuit 280 includes a delay element 281; inverters 282, 283, and 287; a NAND gate 284; AND gates 285, 288, and 290; a ½ divider circuit 286; and an OR gate 289. A person of ordinary skill in the art will readily appreciate that the refresh control circuit 280 illustrated in FIG. 2A is but one implementation of a refresh control circuit configured in accordance with various embodiments of the present technology. Therefore, a person of ordinary skill in the art will also readily recognize that a refresh control circuit can include other components in addition to or in lieu of any one or more of the components of the refresh control circuit 280, and still fall within the scope of the present technology. For example, the refresh control circuit 280 is illustrated with a ½ divider circuit 286 to enable the memory device to skip every other refresh command, but the refresh control circuit 280 can include other divider circuits (e.g., a ⅓ divider circuit to skip every third refresh command) in other embodiments in addition to or in lieu of the ½ divider circuit 286.

As illustrated in FIG. 2A, a refresh command signal REF (e.g., a refresh clock signal REFCLK) is received (e.g., from a command decoder 215 (FIG. 2) of the memory device 200) and is input (i) into the AND gate 285 via the delay element 281 and (ii) into the AND gate 290. The AND gate 285 additionally receives an inverted refresh management signal RFM, an inverted logical product of an inverted mode register signal and a command address bit signal (illustrated as mode register signal MR4[3] and command address bit signal CA8 in FIG. 2A), and a same bank in progress signal. In some embodiments, the command address bit signal CA8 is asserted when the memory device 200 is in 1× refresh mode and is not asserted when the memory device 200 is in 2× refresh mode. The output of the AND gate 285 is input into the ½ divider circuit 286 in addition to a set signal SET. In turn, the output of the ½ divider circuit 286 is input into the OR gate 289 in addition to the refresh management signal RFM and the logical product of the inverted mode register signal and the command address bit signal (again, illustrated as mode register signal MR4[3] and command address bit signal CA8 in FIG. 2A). The output of the OR gate 289 is input into the AND gate 290, and the logical product of the output of the OR gate 289 and the refresh command signal REF is output from the AND gate 290 as an internal refresh signal REF Internal.

In operation, the refresh control circuit 280 is configured to enable the memory device 200 to execute a refresh command (e.g., to output the internal refresh signal REF Internal in a high state) whenever (i) the refresh management signal RFM is asserted, (ii) the mode register signal MR4[3] is not asserted while the command address bit signal CA8 is asserted, and/or (iii) the output of the ½ divider circuit 286 is high. The output of the ½ divider circuit 286 is high whenever (i) the output of the AND gate 285 is high (e.g., when (a) the refresh command signal REF is asserted, (b) the same bank in progress signal is asserted, (c) the refresh management signal is not asserted, and (d) the mode register signal MR4[3] is not asserted while the command address bit signal CA8 is asserted) and (ii) the set signal SET is asserted. In some embodiments, the set signal SET is asserted whenever the mode register signal MR4[3] is not asserted, the temperature of the memory device 200 is greater than or equal to a threshold temperature value (e.g., 85° C.), during set refresh (SFR) mode of the memory device 200, and/or upon entering and exiting fine granular refresh (FGR) mode of the memory device 200. In other words, the refresh control circuit 280 is configured to cause the memory device 200 to skip every other refresh command whenever the refresh management signal is not asserted, the memory device is in 2× refresh mode, and the temperature of the memory device 200 is below the threshold temperature value. A person of ordinary skill in the art will readily recognize, however, that the refresh control circuit 280 can be configured to cause the memory device 200 to skip refresh commands/operations upon the occurrence of other events in addition to or in lieu of the events discussed above.

Figure 3:
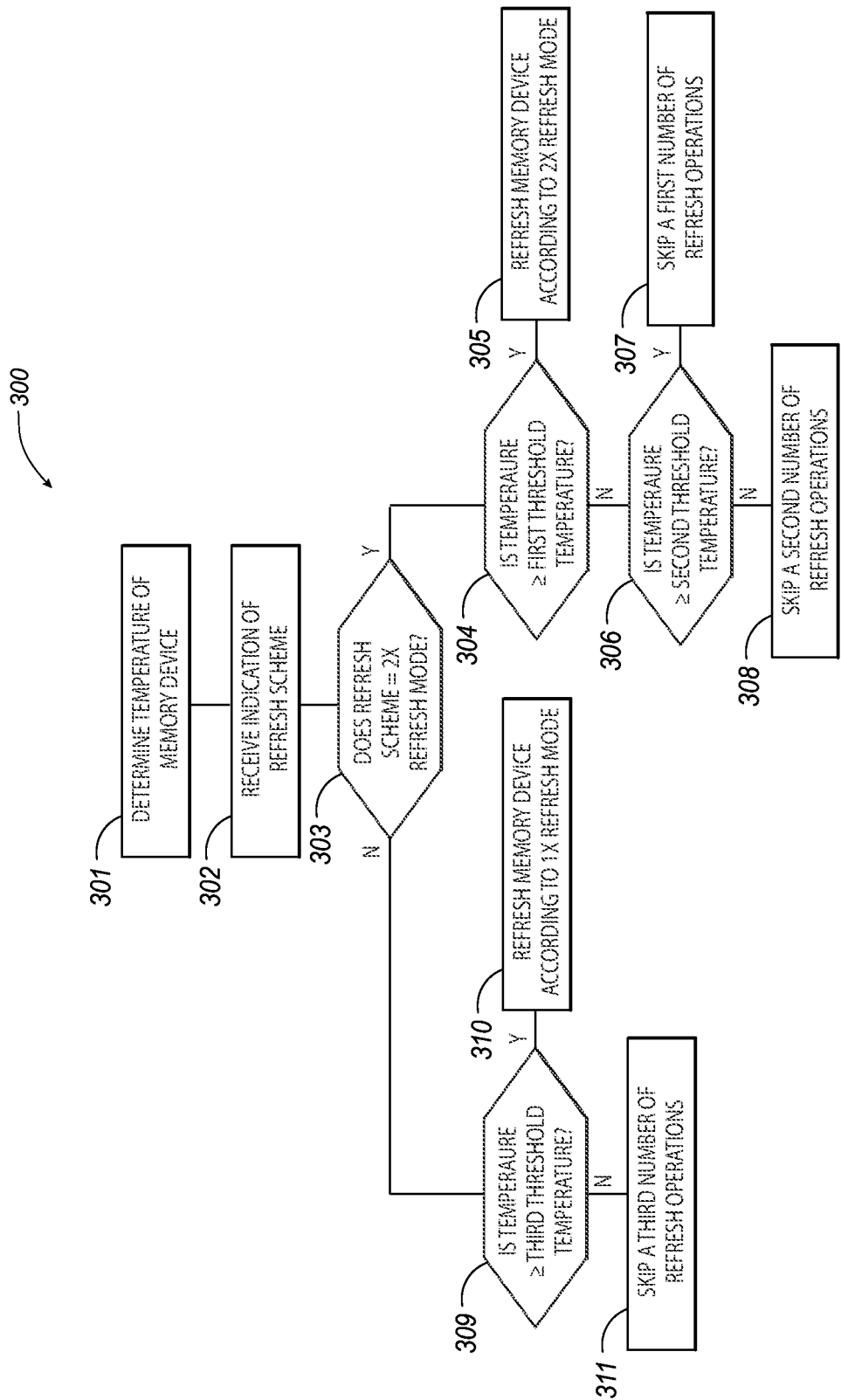
FIGS. 3 and 4 are flow diagrams illustrating routines of memory devices configured in accordance with various embodiments of the present technology.

FIG. 3 is a flow diagram illustrating a routine 300 of a memory device configured in accordance with various embodiments of the present technology. The routine 300 is illustrated as a set of steps, blocks, operations, or processes 301-311. In some embodiments, one or more of the steps 301-311 may be implemented, at least in part, in the form of executable code stored on non-transitory, tangible, machine readable media. All or a subset of the steps 301-311 of the routine 300 can be executed, at least in part, by various components of a memory device (e.g., a memory device 104 of FIG. 1 and/or a memory device 104/200 of FIGS. 1 and 2). In these and other embodiments, one or more of the steps 301-311 can be executed, at least in part, by one or more components of a memory system, such as a memory controller, a PCB, a package substrate, and/or a memory die. In these and still other embodiments, one or more of the steps 301-311 can be executed, at least in part, by a host device operably connected to the memory system, by a manufacturer, by an end user, or by an intermediary party.

As shown, the routine 300 begins at step 301 by determining a temperature of the memory device. For example, the routine 300 determines a temperature of the memory device using one or more temperature measurements generated by a temperature sensor internal to the memory device.

At step 302, the routine 300 receives an indication of a frequency at which the memory device is receiving refresh commands. Such an indication can, for example, notify the routine 300 of a refresh scheme or mode (e.g., a 1× refresh mode, a 2× refresh mode, etc.) of a memory system (e.g., of a memory controller and/or a host device) that includes or is communicatively connected to the memory device. In some embodiments, a refresh mode of the memory device is enabled by programming certain bits of a mode register of the memory device. In these embodiments, the routine 300 can receive the indication via one or more address bits in address signals received by the memory device (e.g., when the memory device registers a refresh command, after the mode register is programmed to place the memory device into the refresh mode, etc.).

At step 303, the routine 300 determines the frequency at which the memory device is receiving refresh commands. In some embodiments, the routine 300 determines the frequency based, at least in part, on the indication received at step 302. For example, the routine 300 can monitor the one or more address bits in address signals received by the memory device to determine the frequency. Continuing with this example, the routine 300 can determine that the memory device is receiving refresh commands at a frequency consistent with a 2× refresh mode (step 303, "Y") when a specified address bit in the address signals received by the memory device is in a first state (e.g., a "low" or "0" state), and the routine 300 can accordingly proceed to step 304 to compare the temperature of the memory device determined at step 301 to a first threshold temperature value. Alternatively, the routine 300 can determine that the memory device is receiving refresh commands at a frequency consistent with a 1× refresh mode (step 303, "N") when the specified address bit in the address signals received by the memory device is in a second state (e.g., a "high" or "1" state), and the routine 300 can accordingly proceed to step 309 to compare the temperature of the memory device determined at step 301 to a third threshold temperature value.

For the sake of clarity and understanding, the frequency at which the memory device is receiving refresh commands in the illustrated embodiment is consistent with one of only two possible refresh schemes (e.g., the 1× refresh mode and the 2× refresh mode). In other embodiments, however, the frequency can be consistent with any number of other possible refresh schemes. In such embodiments, the flow diagram of FIG. 3 can include a corresponding number of additional decision steps (similar to step 303) for determining the frequency at which the memory device is receiving refresh commands, as well as a corresponding number of additional steps (similar to steps 304-311) for determining a number and/or pattern of refresh commands/operations to skip.

At step 304, the routine 300 determines whether the temperature of the memory device determined at step 301 is greater than or equal to a first threshold temperature value. In some embodiments, the first threshold temperature value can be a temperature above (and/or at) which there is a concern that data retention issues will arise in memory cells of the memory device. For example, the first threshold temperature value can be equal to or greater than 70° C. (e.g., 85° C.). In some embodiments, the first threshold temperature value can be the same threshold temperature value as or similar a similar threshold temperature value to the threshold temperature value used by a memory controller to determine the frequency at which to send refresh commands to the memory device, as discussed in greater detail above with respect to FIG. 1. If the routine 300 determines that the temperature of the memory device is greater than or equal to the first threshold temperature value, the routine 300 can accordingly proceed to step 305 to refresh the memory device in accordance with the 2× refresh mode. In other words, the routine 300 can execute a refresh operation for every refresh command received by the memory device. On the other hand, if the routine 300 determines that the temperature of the memory device determined at step 301 is not greater than or equal to the first threshold temperature value, the routine 300 can accordingly proceed to step 306.

At step 306, the routine 300 determines whether the temperature of the memory device determined at step 301 is greater than or equal to a second threshold temperature value. In some embodiments, the second threshold temperature value can be a temperature above (and/or at) which there is concern that data retention issues will arise if the memory device is not regularly refreshed according to a specified refresh rate (e.g., according to the 1× refresh mode). For example, the second threshold temperature value can be between about 45° C. and about 60° C. If the routine 300 determines that the temperature of the memory device is greater than or equal to the second threshold temperature value, the routine 300 can accordingly proceed to step 307 to skip a first number of refresh operations. In some embodiments, the first number of refresh operations corresponds to skipping half of the refresh commands received by the memory device in accordance with the 2× refresh mode. Thus, the routine 300 can execute a refresh operation for every other refresh command (or another pattern of refresh commands) received by the memory device to effectively refresh the memory device in accordance with the 1× refresh mode. As a specific example, in response to receiving a first refresh command directing the memory device to execute a refresh operation, the memory device can execute a refresh operation. In response to receiving a second refresh command directing the memory device to execute a refresh operation, however, the memory device ignores and/or masks the second refresh command such that the memory device refrains from executing a refresh operation. In other embodiments, the first number of refresh operations can correspond to skipping a different number of refresh commands received by the memory device in accordance with the 2× refresh mode.

In some embodiments, the routine 300 track refresh commands received by the memory device. For example, the routine 300 can (i) use a counter (e.g., a register of the memory device) to track whether a last refresh command received by the memory device was executed or ignored, (ii) use a value of the counter to determine whether to perform a refresh operation in response to receiving a current refresh command, and/or (iii) update the value of the counter accordingly after skipping or executing the current refresh command. As another example, when skipping every nth refresh command, the routine 300 can (i) use a counter to track how many refresh operations have been executed in response to receiving refresh commands, (ii) skip executing a refresh operation in response to receiving a refresh command after a value of the counter reaches n−1, and (iii) reset the value of the counter to zero after skipping a refresh operation in response to receiving the nth refresh command. In these and other embodiments, the routine 300 can use more than one counter to skip various patterns of refresh operations. For example, the routine 300 can (i) use a first counter to refrain from executing a refresh operation in response to receiving every other refresh command and (ii) use a second counter to refrain from executing an additional one of every three refresh operations that would otherwise be executed in response to receiving every other refresh command when monitoring only the first counter.

Referring again to block 306, if the routine 300, on the other hand, determines that the temperature of the memory device is not greater than or equal to the second threshold temperature value, the routine 300 can accordingly proceed to step 308 to skip a second number of refresh operations. The second number of refresh operations can be greater than the first number of refresh operations. For example, the second number of refresh operations can correspond to skipping every other refresh command received by the memory device in accordance with the 2× refresh mode, as well as skipping an additional one of every three refresh commands that would otherwise be executed by the routine 300 at step 307. Continuing with this example, for every group of six consecutive refresh commands received by the memory device, the routine 300 can skip the sixth refresh command received by the memory device in addition to the first, third, and fifth refresh commands received by the memory device. In other words, the routine 300 (at step 308) in this example would execute two of every three refresh commands that would otherwise be executed by the routine 300 at step 307. In other embodiments, the second number of refresh operations can correspond to skipping a different number and/or pattern of refresh commands received by the memory device in accordance with the 2× refresh mode.

Returning again to step 303, if the routine 300 determines that the memory device is receiving refresh commands at a frequency consistent with the 1× refresh mode (step 303, "N"), the routine 300 proceeds to step 309. At step 309, the routine 300 determines whether the temperature of the memory device determined at step 301 is greater than or equal to a third threshold temperature value. In some embodiments, the third threshold temperature value can be a temperature above (and/or at) which there is concern that data retention issues will arise if the memory device is not regularly refreshed according to a specified refresh rate (e.g., according to the 1× refresh mode). For example, the third threshold temperature value can be the same as second threshold temperature value. In other embodiments, the third threshold temperature value can be a different threshold temperature value than the second threshold temperature value.

If the routine 300 determines that the temperature of the memory device is greater than or equal to the third threshold temperature value, the routine 300 can accordingly proceed to step 310 to refresh the memory device according to the 1× refresh mode. In other words, the routine 300 can execute a refresh operation for every refresh command received by the memory device. On the other hand, if the routine 300 determines that the temperature of the memory device determined at step 301 is not greater than or equal to the third threshold temperature value, the routine can accordingly proceed to step 311.

At step 311, the routine 300 skips a third number of refresh commands received by the memory device. In some embodiments, the third number of refresh operations corresponds to skipping one third of the refresh commands received by the memory device in accordance with the 1× refresh mode. Thus, in these embodiments, the routine 300 can skip every third (or another pattern) of refresh commands received by the memory device. In other embodiments, the third number of refresh operations can correspond to skipping a different number of refresh commands received by the memory device in accordance with the 1× refresh mode.

Although the steps 301-311 of the routine 300 are discussed and illustrated in a particular order, the method illustrated by the routine 300 in FIG. 3 is not so limited. In other embodiments, the steps 301-311 can be performed in a different order. For example, any of the steps 301-311 of the routine 300 can be performed before, during, and/or after any of the other steps 301-311 of the routine 300. As a specific example, step 302 and/or step 303 can be performed before and/or during step 301. Moreover, a person of ordinary skill in the relevant art will readily recognize that the illustrated method can be altered and still remain within these and other embodiments of the present technology. For example, one or more of the steps 301-311 of the routine 300 illustrated in FIG. 3 can be omitted and/or repeated in some embodiments. As a specific example, steps 306 and/or step 308 can be omitted in some embodiments such that the routine 300 proceeds to step 307 after determining that the temperature of the memory device is not greater than or equal to the first threshold temperature. As another specific example, steps 309 and/or step 311 can be omitted in some embodiments such that the routine 300 proceeds to step 310 after determining that the refresh scheme is not the 2× refresh mode at step 303. In these and other embodiments, one or more of the steps 301-311 of the routine 300 can be combined (at least in part). In these and still other embodiments, the routine 300 can include additional steps than shown in FIG. 3. For example, the routine 300 can compare the temperature of the memory device determined at step 301 to one or more additional threshold temperatures (e.g., one or more additional threshold temperatures above and/or below the first, second, and/or third threshold temperatures) and/or can accordingly skip different numbers of refresh operations (e.g., numbers greater than and/or less than the first, second, and/or third numbers of refresh operations) based, at least in part, on the additional comparisons.

Figure 4:
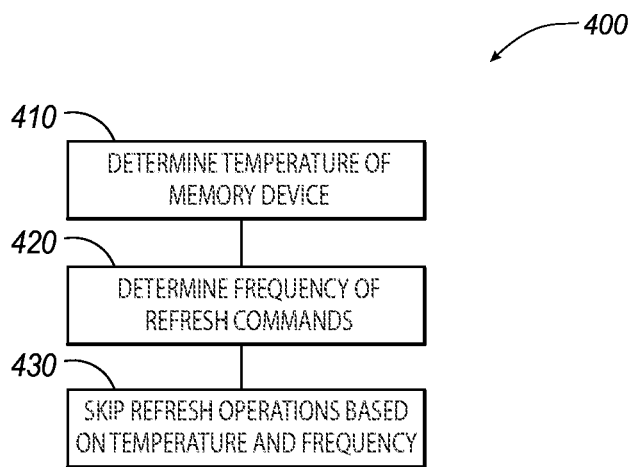

FIG. 4 is a flow diagram illustrating a routine 400 of a memory device configured in accordance with various embodiments of the present technology. The routine 400 is illustrated as a set of steps, blocks, operations, or processes 410, 420, and 430. In some embodiments, one or more of the steps 410, 420, and 430 may be implemented, at least in part, in the form of executable code stored on non-transitory, tangible, machine readable media. All or a subset of the steps 410, 420, and 430 of the routine 400 can be executed, at least in part, by various components of a memory device (e.g., a memory device 104 of FIG. 1 and/or a memory device 104/200 of FIGS. 1 and 2). In these and other embodiments, one or more of the steps 410, 420, and 430 can be executed, at least in part, by one or more components of a memory system, such as a memory controller, a PCB, a package substrate, and/or a memory die. In these and still other embodiments, one or more of the steps 410, 420, and 430 can be executed, at least in part, by a host device operably connected to the memory system, by a manufacturer, by an end user, or by an intermediary party.

The routine 400 begins at block 410 by determining a temperature of the memory device. In some embodiments, the routine 400 determines a temperature of the memory device using one or more temperature measurements generated by a temperature sensor internal to the memory device.

At block 420, the routine 400 continues by determining a frequency at which refresh commands are being received by and/or sent to the memory device. In some embodiments, the routine 400 determines the frequency by receiving a notification indicating the frequency. For example, the routine 400 can receive the notification via one or more address bits in address signals received by the memory device (e.g., when the memory device registers a refresh command, after a mode register of the memory device is programmed to place the memory device into a refresh mode, etc.). Continuing with this example, the routine 400 can determine the frequency by monitoring the one or more address bits in the address signals. In one embodiment, the routine 400 can determine the frequency is a first frequency when a specified address bit in the address signals received by the memory device is in a first state (e.g., a "low" or "0" state), and can determine the frequency is a second frequency when the specified address bit is in a second state (e.g., a "high" or "1" state).

At block 430, the routine 400 continues by skipping refresh operations based, at least in part, on the temperature of the memory device determined at block 410 and on the frequency at which the memory device is receiving and/or is being sent refresh commands. For example, when the memory device is receiving refresh commands at a higher frequency, the routine 400 can (i) skip a first number (e.g., zero) of refresh operations when the temperature is at or above a first threshold temperature value, (ii) skip a second number of (e.g., corresponding to every other) refresh operations when the temperature is below the first threshold temperature value, and/or (iii) skip a third number (e.g., greater than the second number) of refresh operations when the temperature is below a second threshold temperature value (e.g., less than the first threshold temperature value). Additionally, or alternatively, when the memory device is receiving refresh commands at a lower frequency, the routine 400 can (i) skip a first number (e.g., zero) of refresh operations when the temperature is below the first threshold temperature value and/or (ii) skip a second number (e.g., greater than the first number, corresponding to every third, etc.) of refresh operations when the temperature is below a second threshold temperature value (e.g., less than the first threshold temperature value). In some embodiments, skipping refresh operations includes (i) receiving one or more refresh commands directing the memory device to execute one or more refresh operations and (ii) in response to receiving the one or more refresh commands, refraining from executing at least a subset of the one or more refresh operations.

Although the steps 410, 420, and 430 of the routine 400 are discussed and illustrated in a particular order, the method illustrated by the routine 400 in FIG. 4 is not so limited. In other embodiments, the steps 410, 420, and 430 can be performed in a different order. For example, any of the steps 410, 420, and 430 of the routine 400 can be performed before, during, and/or after any of the other steps 410, 420, and 430 of the routine 400. As a specific example, step 420 can be performed before and/or during step 410. Moreover, a person of ordinary skill in the relevant art will readily recognize that the illustrated method can be altered and still remain within these and other embodiments of the present technology. For example, one or more of the steps 410, 420, and 430 of the routine 400 illustrated in FIG. 4 can be omitted and/or repeated in some embodiments. In these and other embodiments, one or more of the steps 410, 420, and 430 of the routine 400 can be combined (at least in part). In these and still other embodiments, the routine 400 can include additional steps than shown in FIG. 4.

FIGS. 3 and 4 and the corresponding discussion above assumes that a single refresh operation executed in response to a single refresh command received by a memory device refreshes every memory cell in a memory array of the memory device. Refresh operations executed in response to a single refresh command in other embodiments, however, can refresh a single memory region representing a subset of the memory cells in the memory array of the memory device. For example, a single refresh operation executed in response to receiving a single refresh command in some embodiments can refresh a single memory bank in every memory bank group of the memory array. In these embodiments, the routine 300 of FIG. 3 and/or the routine 400 can skip greater numbers of refresh operations received by the memory device to achieve a desired refresh rate of the entire memory array. For example, the routine 300 can skip greater number of refresh operations received by the memory device at steps 307, 308, and/or 311 to achieve a desired refresh rate of the entire memory array. For the sake of clarity and understanding, consider the following numerical example. Assuming that the memory array of a memory device includes four memory banks arranged in four memory bank groups, the memory device would need to execute four refresh operations in response to receiving four consecutive refresh commands to refresh the entire memory array. Thus, in this example, each executed refresh operation refreshes a single memory bank in every memory bank group. Therefore, to skip the first number (e.g., half) of the refresh operations, the routine 300 at step 307 could alternate between (i) executing four refresh operations in a row in response to receiving four consecutive refresh commands and (ii) skipping four refresh operations in a row in response to receiving the next four consecutive refresh commands.

Figure 5:
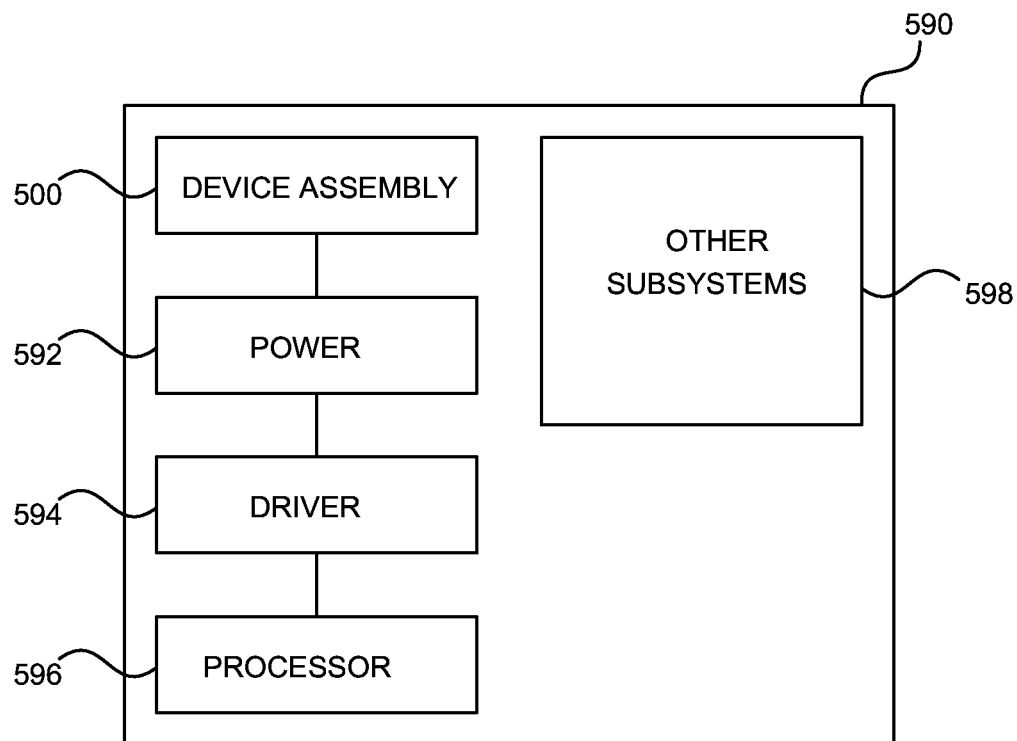
FIG. 5 is a schematic view of a system that includes a memory device configured in accordance with various embodiments of the present technology.

FIG. 5 is a schematic view of a system that includes a memory device configured in accordance with various embodiments of the present technology. Any one of the foregoing memory systems, devices, and/or dies described above with reference to FIGS. 1-4 can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems and components 598. The semiconductor device assembly 500 can include features generally similar to those of the memory systems, devices, and/or dies described above with reference to FIGS. 1-4, and can, therefore, include various features of programmable die refresh stagger. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, vehicles, appliances, and other products. Components of the system 590 may be housed in a single unit or distributed over multiple, interconnected units (e.g., through a communications network). The components of the system 590 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Additionally, the terms "comprising," "including," "having" and "with" are used throughout to mean including at least the recited feature(s) such that any greater number of the same feature and/or additional types of other features are not precluded. As used herein, the phrase "and/or" as in "A and/or B" refers to A alone, B alone, and both A and B.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A memory device, comprising:
a plurality of memory cells;
a first counter having a first value corresponding to refresh operations of the memory cells;
a second counter different from the first counter and having a second value corresponding to the refresh operations of the memory cells; and
a sensor configured to measure a temperature of the memory device,
wherein the memory device is configured to:
skip, based at least in part on the first value, a first number of refresh operations of the memory cells when the temperature of the memory device is less than a first threshold value and greater than a second threshold value, the first number being greater than zero; and
skip, based at least in part on the second value, a second number of the refresh operations of the memory cells when the temperature of the memory device is less than the second threshold value, the second number being greater than the first number.

2. The memory device of claim 1, wherein the memory device is further configured to execute each of the refresh operations of the memory cells when the temperature of the memory device is greater than the first threshold value.

3. The memory device of claim 1, wherein the first threshold value is equal to or greater than 70° C.

4. The memory device of claim 1, wherein the first number of refresh operations corresponds to skipping every other one of the refresh operations of the memory cells.

5. The memory device of claim 1, wherein the second number of refresh operations corresponds to skipping every other one of the refresh operations of the memory cells and to skipping an additional one of every three of the refresh operations of the memory cells.

6. The memory device of claim 1, wherein the second threshold value is between 45° C. and 60° C.

7. The memory device of claim 1, wherein, to skip the first number or the second number of the refresh operations of the memory cells, the memory device is configured to ignore or mask corresponding refresh commands received by the memory device.

8. The memory device of claim 1, wherein the memory device is further configured to:
    determine whether the memory device is receiving refresh commands corresponding to the refresh operations of the memory cells at a first frequency or at a second frequency greater than the first frequency;
    skip the first number of refresh operations of the memory cells when (i) the memory device determines the memory device is receiving the refresh commands at the second frequency and (ii) the temperature of the memory device is less than the first threshold value and greater than the second threshold value; and
    skip the second number of refresh operations of the memory cells when (i) the memory device determines the memory device is receiving the refresh commands at the second frequency and (ii) the temperature of the memory device is less than the second threshold value.

9. The memory device of claim 8, wherein the memory device is further configured to skip a third number of refresh operations of the memory cells when (i) the memory device determines the memory device is receiving the refresh commands at the first frequency and (ii) the temperature of the memory device is less than a third threshold value.

10. The memory device of claim 9, wherein the third threshold value is between 45° C. and 60° C.

11. The memory device of claim 9, wherein the third number of refresh operations corresponds to skipping every third one of the refresh operations of the memory cells.

12. The memory device of claim 9, wherein the memory device is further configured to execute each of the refresh operations of the memory cells when:
    the temperature of the memory device is greater than the third threshold value and the memory device determines that the memory device is receiving the refresh commands at the first frequency; or
    the temperature of the memory device is greater than the first threshold value and the memory device determines that the memory device is receiving the refresh commands at the second frequency.

13. A memory device, comprising:
    a plurality of memory cells; and
    a sensor configured to measure a temperature of the memory device,
    wherein the memory device is configured to:
        determine whether the memory device is receiving refresh commands at a first frequency or at a second frequency greater than the first frequency;
        skip a first number of refresh operations of the memory cells when (i) the memory device determines the memory device is receiving the refresh commands at the second frequency and (ii) the temperature of the memory device is less than a first threshold value; and
        skip a second number of refresh operations of the memory cells different from the first number when (i) the memory device determines the memory device is receiving the refresh commands at the second frequency and (ii) the temperature of the memory device is less than a second threshold value different from the first threshold value.

14. A memory device, comprising:
    a plurality of memory cells;
    a first counter having a first value corresponding to refresh operations of the memory cells and
    a second counter having a second value corresponding to the refresh operations of the memory cells,
    wherein the memory device is configured to:
        determine that the memory device is receiving refresh operations at an increased frequency;
        based at least in part on the determination and on the first value of the counter, skip a first number of the refresh operations of the memory cells; and
        based at least in part on the determination and the second value of the second counter, skip a second number of the refresh operations of the memory cells different than the first number.

15. The memory device of claim 14, wherein the memory device is configured to skip the first number of the refresh operations of the memory cells further based on an internal temperature of the memory device.

16. The memory device of claim 14, wherein the first value of the first counter indicates whether a refresh operation corresponding to a last refresh command received by the memory device was executed or skipped by the memory device.

17. The memory device of claim 14, wherein:
    the first counter is configured to increment the first value for each refresh operation executed by the memory device;
    the memory device is configured to skip a next refresh operation of the memory cells when the first value of the first counter reaches a first threshold value; and
    the first counter is further configured to reset the first value after the memory device skips the next refresh operation.

18. The memory device of claim 1, wherein the memory device is configured to skip, based at least in part on the first value and on the second value, the second number of the refresh operations of the memory cells when the temperature of the memory device is less than the second threshold value.

19. The memory device of claim 13, wherein the memory device is further configured to skip a third number of refresh operations of the memory cells different from the first and second numbers when (i) the memory device determines the memory device is receiving the refresh commands at the first frequency and (ii) the temperature of the memory device is less than a third threshold value.

20. The memory device of claim 19, wherein the third threshold value is equivalent to the first threshold value.

* * * * *